United States Patent
Lee et al.

(10) Patent No.: US 11,493,750 B2
(45) Date of Patent: Nov. 8, 2022

(54) LASERCOM ACQUISITION AND TRACKING SENSOR

(71) Applicant: The Aerospace Corporation, El Segundo, CA (US)

(72) Inventors: Shinhak Lee, Valencia, CA (US); Ryan Michael Miller, La Mirada, CA (US); Kevin Li Chow, La Canada Flintridge, CA (US); Tuong-vi Thi Tran, Garden Grove, CA (US); Farheen Rizvi, Azusa, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 446 days.

(21) Appl. No.: 16/672,318

(22) Filed: Nov. 1, 2019

(65) Prior Publication Data

US 2021/0132369 A1   May 6, 2021

(51) Int. Cl.
G02B 26/08 (2006.01)
B81B 3/00 (2006.01)
G02B 26/10 (2006.01)

(52) U.S. Cl.
CPC ........ *G02B 26/0841* (2013.01); *B81B 3/0083* (2013.01); *G02B 26/101* (2013.01); *B81B 2201/04* (2013.01)

(58) Field of Classification Search
CPC .............. G02B 26/0841; G02B 26/101; G02B 26/0833; B81B 3/0083; B81B 2201/04
USPC ...................................................... 359/200.7
See application file for complete search history.

(56) References Cited

U.S. PATENT DOCUMENTS 8,203,703 B1 *   6/2012   Kane .................. G02B 26/0833
356/141.5

OTHER PUBLICATIONS

Michael Taylor et al., "Polar Orbiting Infrared Tracking Receiver (POINTR)", IEEE, 978-1-5386-2014-4, 2018.
Yagiz Kaymak, "A Survey on Acquisition, Tracking, and Pointing Mechanisms for Mobile Free-Space Optical Communications", IEEE Communications Surveys & Tutorials, vol. 20, No. 2, Second Quarter 2018.

* cited by examiner

*Primary Examiner* — Euncha P Cherry
(74) *Attorney, Agent, or Firm* — LeonardPatel PC

(57) ABSTRACT

An acquisition and tracking sensor includes a quad detector with a narrow field of view (NFOV) and a micro-electromechanical system (MEMS) mirror with a wide field of view (WFOV). The quad detector is placed behind the MEMS mirror to produce a WFOV to allow the quad detector to scan a larger area for the incoming laser beam.

22 Claims, 5 Drawing Sheets

400

LASERCOM ACQUISITION AND TRACKING SENSOR

FIELD

The present invention relates to an acquisition and tracking sensor, and more particularly, to an acquisition and tracking sensor using a quad detector and a micro-electromechanical system (MEMS) mirror.

BACKGROUND

Lasercom technology generally requires a large field-of-view (FOV) acquisition camera to acquire an incoming laser beam from another Lasercom terminal. Additionally, a small FOV tracking quad detector is employed for centroiding the incoming laser beam at a high rate such that the closed tracking control loop can compensate spacecraft vibration.

The problem, however, is that the acquisition camera has a relatively large SWaP (Size, Weight, and Power) and requires high level of computing power when reading a plurality of pixels. This poses challenges of using the active tracking and pointing laser beams from small Lasercom terminals onboard of a CubeSat, for example.

Currently, the functions of acquisition and tracking of the incoming laser beam are maintained by two separate sensors (i.e., acquisition sensor and tracking sensor). Acquisition sensor is usually a wide FOV (WFOV) Focal Plane Array (FPA) and the tracking sensor is a narrow FOV (NFOV) sensor, typically some type of quadrant detector. In some cases, there have been attempts to use one sensor to combine both functions using the FPA, which has a special function called subwindowing. Subwindowing is the capability of accessing any pixel information within the FPA, thereby enabling fast retrieval of the relevant laser beam location estimates. The other case is where two quadrant detectors are used for both functions, one for WFOV acquisition and the other for NFOV tracking. In this second case, identification of the incoming beacon against background noise can be very challenging.

Going back to the above, the limitation is in the acquisition sensor. The acquisition sensor is a large format FPA that requires fast processing of reading a plurality of pixels and finding the incoming laser beam spot from the FPA. Therefore, complex design, high power consumption, high weight, and large volume are inevitable in the design. Thus, an acquisition and tracking sensor that uses micro-electromechanical system (MEMS) mirror and quad detector to achieve both functions of acquisition and tracking of the incoming laser beam would be more beneficial.

SUMMARY

Certain embodiments of the present invention may provide solutions to the problems and needs in the art that have not yet been fully identified, appreciated, or solved by current incoming laser beam acquisition and tracking systems. For example, some embodiments generally pertain to an acquisition and tracking sensor.

In an embodiment, a computer-implemented process includes performing continuous scanning in an x-direction and in a y-direction until a laser beam is detected on a quad detector. The computer-implemented process also includes upon detecting the incoming laser on the quad detector, transitioning the quad detector from an acquisition mode to a tracking mode. The computer-implemented process further includes adjusting a MEMS mirror to center the laser beam on the quad detector, when the incoming laser beam is not centered on the quad detector.

In another embodiment, an apparatus for acquiring an incoming laser beam includes a quad detector with a NFOV and a MEMS mirror with a WFOV. The quad detector is placed behind the MEMS mirror to produce a WFOV to allow the quad detector to scan a larger area for the incoming laser beam.

In yet another embodiment, an acquisition and tracking sensor includes a quad detector with a NFOV placed behind a MEMS mirror with a WFOV. The placement of the quad detector behind the MEMS mirror allows for the quad detector to scan a larger area for an incoming laser beam. Further, the MEMS mirror is configured to continuously scan in an x-direction and in a y-direction until the incoming laser beam is detected on the quad detector, and upon detecting the incoming laser beam on the quad detector, center the incoming laser beam on the quad detector, when the incoming laser beam is not centered on the quad detector.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 4 is an image illustrating a conventional camera with a laser on.

DETAILED DESCRIPTION OF THE EMBODIMENTS

Some embodiments of the present invention pertain to an acquisition and tracking sensor using a MEMS mirror and a quad detector. For example, in some embodiments, only one laser beam is necessary while meeting the functions and performance of both acquisition and tracking. This effectively lowers the requirement of the incoming laser beam power.

Further, in some embodiments, both acquisition and tracking functions are achieved with a simple, low cost, and low SWaP MEMS mirror. This enables CubeSat Lasercom to communicate at an order of magnitude higher in data rate as compared to the conventional acquisition and tracking techniques.

Figure 1:
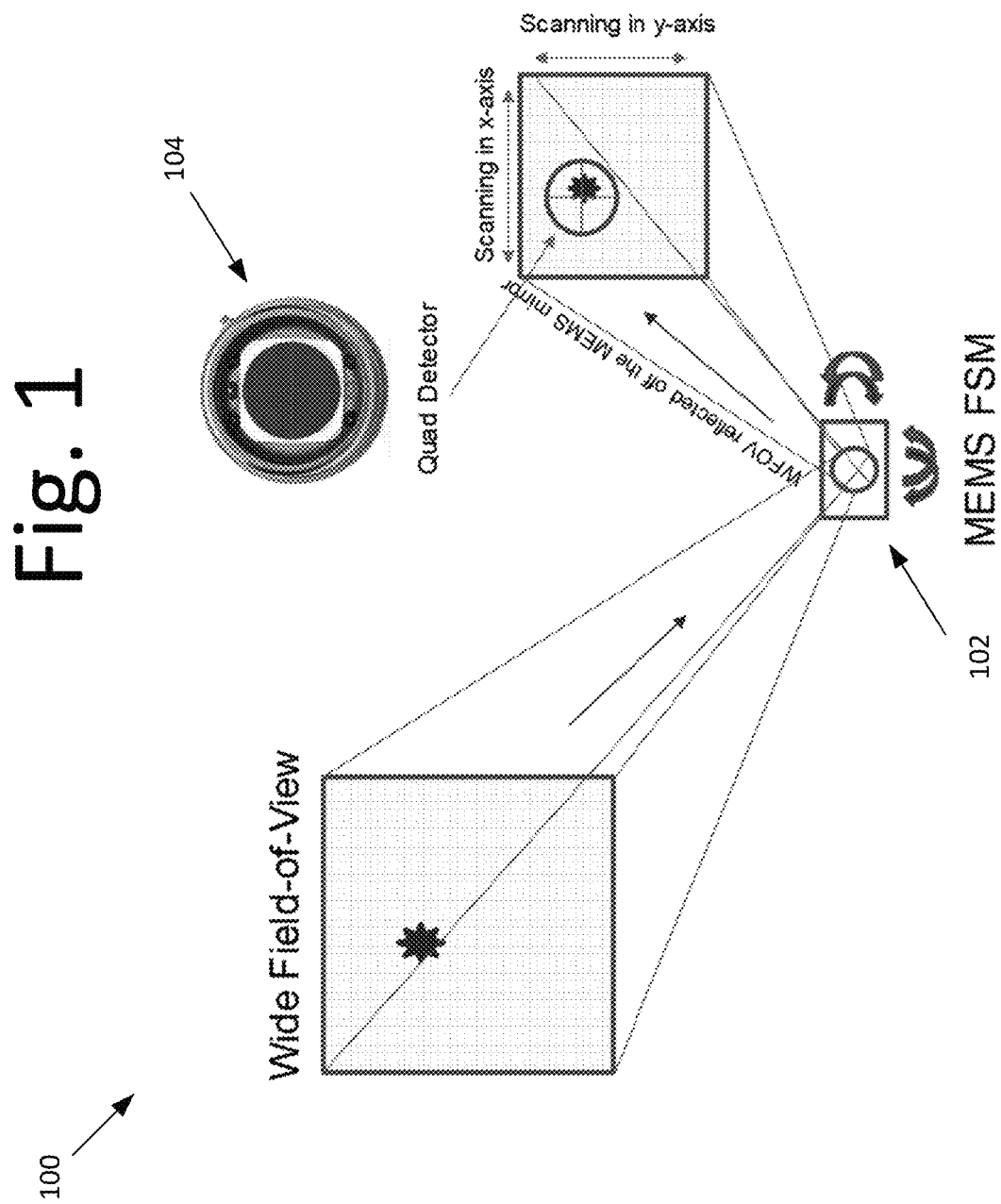
FIG. 1 is a block diagram illustrating an acquisition and tracking sensor using a MEMS mirror and a quad detector, according to an embodiment of the present invention.

FIG. 1 is a block diagram illustrating an acquisition and tracking sensor 100 using a MEMS mirror 102 and a quad detector 104, according to an embodiment of the present invention. Since the acquisition function of detecting a laser beam is impossible with the use of only a quad detector 104, some embodiments utilize MEMS mirror 102. As noted above, quad detector 104 has a NFOV. By using MEMS mirror 102, which has a WFOV, a larger area is scanned. For example, MEMS mirror 102 reflects a WFOV to allow quad detector 104 to scan a larger area for an incoming beam.

Initially, in the acquisition mode, the angular position of MEMS mirror 102 is command such that quad detector 104 begins scanning for an incoming beam in the upper left corner of the WFOV of MEMS mirror 102. A more detailed explanation follows in the subsequent paragraphs.

To detect the incoming laser beam, MEMS mirror 102 and quad detector 104 are initially in the acquisition mode. By using MEMS mirror 102 with quad detector 104, a WFOV is scanned in an x- and y-direction until the incoming laser beam is detected by quad detector 104. For example, MEMS mirror 102 scans in a positive x-direction (e.g., from left to right, one step at a time), followed by a negative y-direction (e.g., down one step), and then again in negative x-direction (e.g., from right to left, one step at a time). This scanning is continuously repeated until the incoming laser beam is detected by quad detector 104.

Upon detection of the incoming laser beam, MEMS mirror 102 and quad detector 104 are switched to a tracking mode to command the transmit laser beam. However, prior to commanding the transmit laser beam, MEMS mirror 102 is adjusted to centrally locate the incoming laser beam within quad detector 104. Using each individual output of quad detector 104, the location of incoming laser beam is calculated in relation to each cell in the quad detector. This way, the x-position and y-position of the incoming laser beam is determined within quad detector 104.

In some embodiments, MEMS mirror 102 can be packaged with quad detector 104 in a 1 in.×1 in. design to create a lightweight acquisition and tracking sensor suitable for a CubeSat. Another advantage of the proposed design is the low power consumption which is a fraction of an 1 W. This is particularly attractive since the CubeSat is highly constrained in the available power due to its small solar panels.

Figure 2:
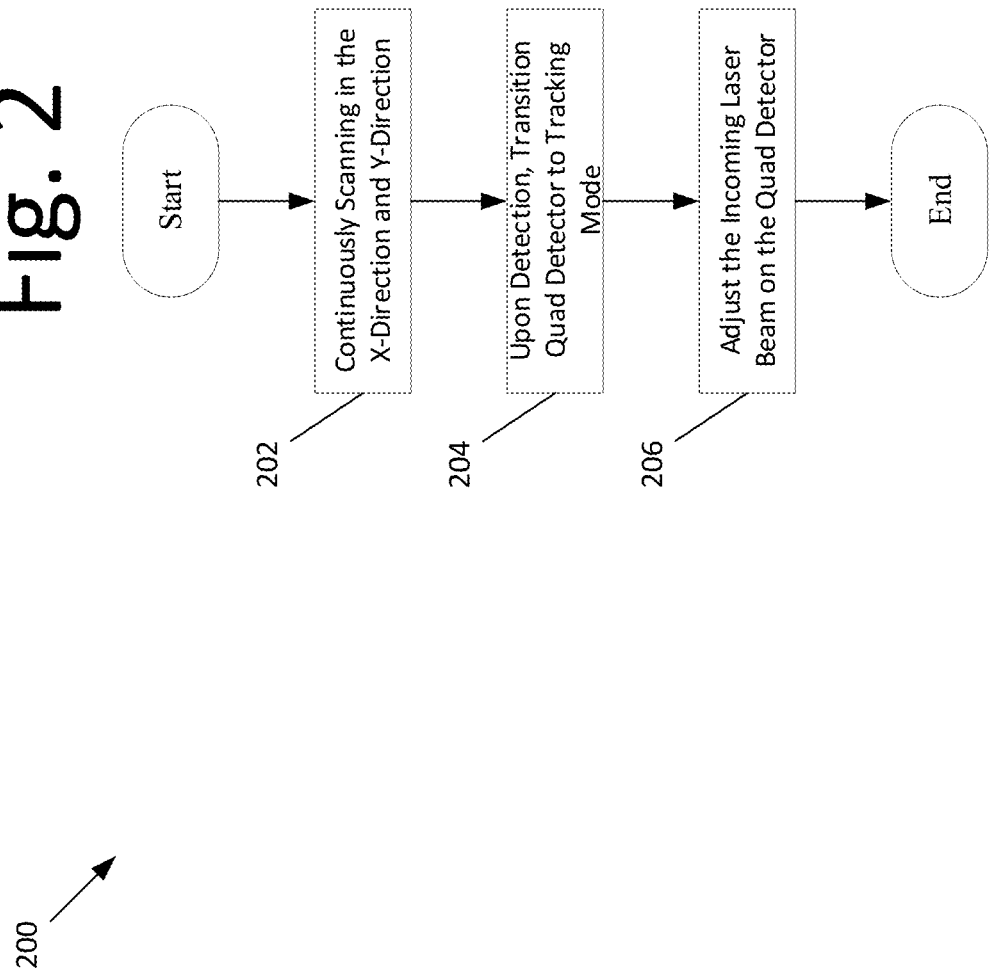
FIG. 2 is a flow diagram illustrating a process for detecting an incoming laser beam using the acquisition and tracking sensor, according to an embodiment of the present invention.

FIG. 2 is a flow diagram illustrating a process 200 for detecting an incoming laser beam using the acquisition and tracking sensor, according to an embodiment of the present invention. In some embodiments, process 200 begins at 202 with using a MEMS mirror to continuously scan in an x-direction and y-direction until an incoming laser beam is detected on a quad detector. At 104, upon detecting the incoming laser beam on the quad detector, transitioning the quad detector from an acquisition mode to a tracking mode. At 106, the MEMS mirror is adjusted to center the incoming laser beam on the quad detector, when the incoming laser beam is not centered on the quad detector.

Figure 3:
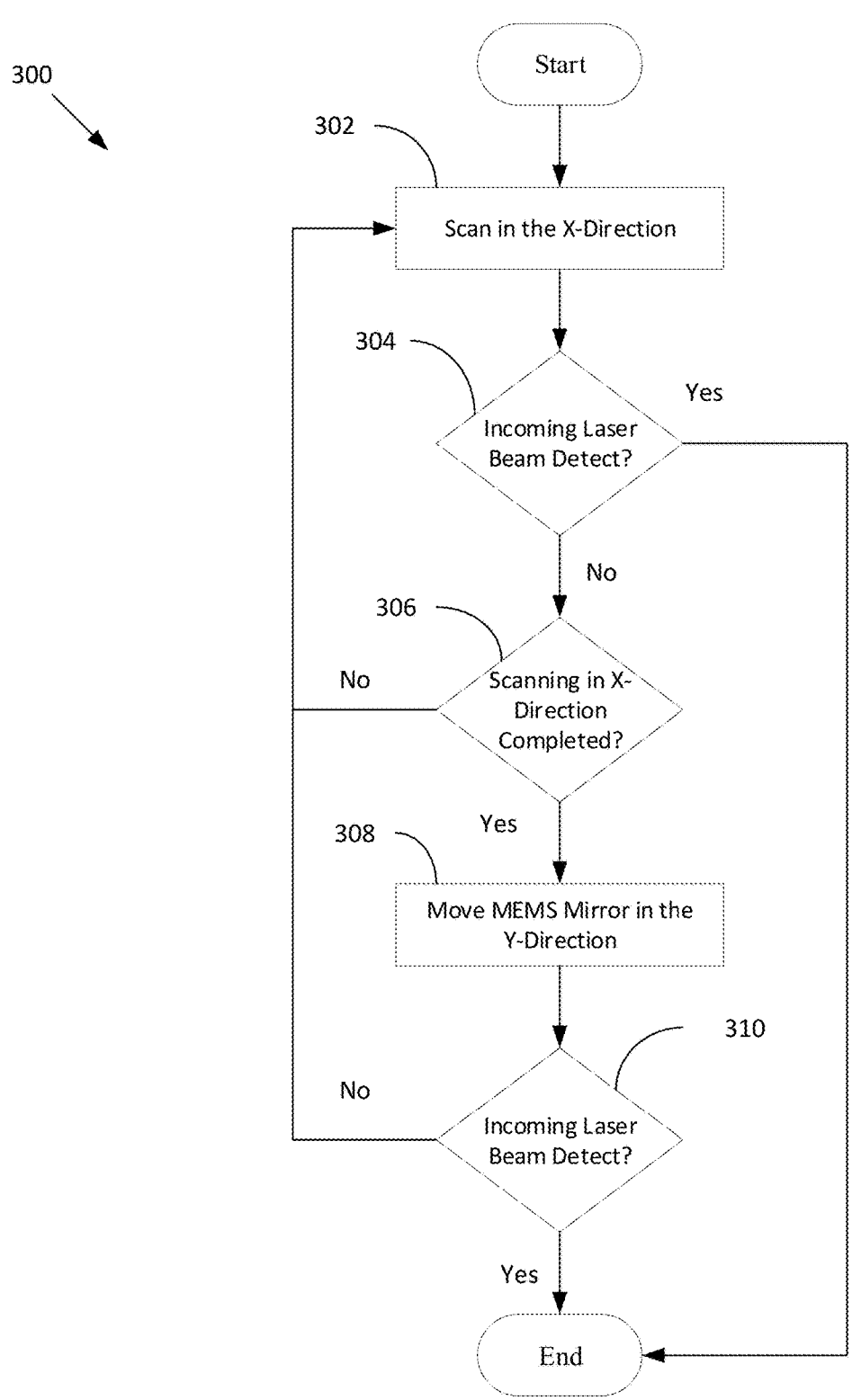
FIG. 3 is a flow diagram illustrating acquisition procedures using the MEMS mirror and quad detector, according to an embodiment of the present invention.

FIG. 3 is a flow diagram illustrating a process 300 for continuously scanning in a x-direction and y-direction, according to an embodiment of the present invention. In some embodiments, process 300 begins at 302 with MEMS mirror scanning in a x-direction. At 304, if the quad detector detects an incoming laser beam, then the process ends. If, however, the quad detector does not detect an incoming laser beam, and at 306, the scanning in the x-direction is not completed, then the process repeats at 302. If, however, the MEMS mirror completed scanning in the x-direction, then at 308, the MEMS mirror is moved in the y-direction. At 310, if the quad detector detects an incoming laser beam, then the process ends. If, however, the quad detector does not detect an incoming laser beam, then the process repeats at 302.

Essentially, this process continues until the quad detector detects an incoming laser beam in the WFOV provided by the MEMS mirror.

Figure 4:
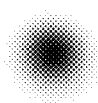

FIG. 4 is an image 400 illustrating a conventional camera with a laser on. The conventional Lasercom acquisition sensor output, such as camera image 400, is processed such that the signals above a certain threshold value are recognized as the laser beacon (acquisition).

Figure 5:
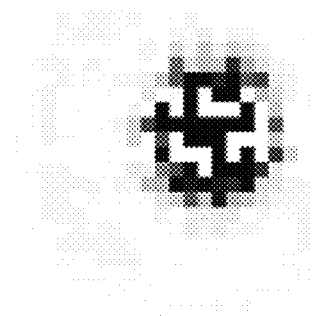
FIG. 5 is an image illustrating a large beam spot due to overlap of quad cell, according to an embodiment of the present invention.

FIG. 5 is an image 500 illustrating a large beam spot due to overlap of NFOV quad cell in the MEMS mirror WFOV, according to an embodiment of the present invention. Image 500 is comprised of quad detector outputs at the X and Y positions of the MEMS mirror scanning. Further, image 500 in FIG. 5 is a functional demonstration of acquisition and tracking sensor where the MEMS mirror scanning and quad detector were used to generate an equivalent image to that shown in FIG. 4. The large size of the incoming laser beam is due to the large quad detector. Depending on the embodiment, the size of the incoming laser beam can be adjusted.

In an embodiment, a computer-implemented process includes performing continuous scanning in an x-direction and in a y-direction until an incoming laser beam is detected on a quad detector. Upon detecting the incoming laser beam on the quad detector, transitioning the quad detector from an acquisition mode to a tracking mode, and when the incoming laser beam is not centered on the quad detector, adjusting the micro-electromechanical system (MEMS) mirror to center the incoming laser beam on the quad detector.

In certain embodiments, the method includes repeating the continuous scanning in the x-direction and the y-direction, when the incoming laser beam is lost on the quad detector.

In some embodiments, the performing of the continuous scanning includes repeatedly scanning in the x-direction until the incoming laser beam is detected on the quad detector or until the MEMS mirror completes scanning in the x-direction. The method also includes, when the MEMS mirror completes scanning in the x-direction, moving the MEMS mirror in a y-direction and repeatedly scanning in the x-direction until the incoming laser beam is detected on the quad detector or until the MEMS mirror completes scanning in the x-direction.

Also, it should be noted that the adjusting of the MEMS mirror to centrally locate the incoming laser beam occurs prior to commanding a transmit laser beam. Further, the adjusting of the MEMS mirror includes, using each individual output of the quad detector, calculating a location of the incoming laser beam in relation to each cell in the quad detector such that the x-position and y-position of the incoming laser beam is determined within quad detector.

In some additional embodiments, the method includes positioning the quad cell behind the MEMS mirror to produce a WFOV to scan a larger area for the incoming laser beam.

In another embodiment, an apparatus includes a quad detector with a NFOV, and a MEMS mirror with a WFOV. The quad detector is placed behind the MEMS mirror to produce a WFOV to allow the quad detector to scan a larger area for the incoming laser beam.

In these embodiments, the MEMS mirror may be configured to continuously scan in an x-direction and in a y-direction until the incoming laser beam is detected on the quad detector, and upon detecting the incoming laser beam on the quad detector, center the incoming laser beam on the quad detector, when the incoming laser beam is not centered on the quad detector.

Also, in some of these embodiments, the quad detector is transitioned from an acquisition mode to a tracking mode when the quad detector detects the incoming laser beam.

Regarding the MEMS mirror, it may be configured to repeat the scanning in the x-direction and the y-direction when the incoming laser beam is lost on the quad detector, and may also be configured to repeatedly scan in the x-direction until the incoming laser beam is detected on the quad detector or until the MEMS mirror completes scanning in the x-direction.

When the MEMS mirror completes scanning in the x-direction, the MEMS mirror is further configured to move in a y-direction, allowing for scanning in the x-direction until the incoming laser beam is detected on the quad detector or until the MEMS mirror completes scanning in the x-direction.

In certain embodiments, the adjustment of the MEMS mirror to centrally locate the incoming laser beam occurs prior to commanding a transmit laser beam. Further, the MEMS uses each individual output of the quad detector to calculate a location of the incoming laser beam in relation to each cell in the quad detector such that the x-position and y-position of the incoming laser beam is determined within quad detector.

In yet another embodiment, an acquisition and tracking sensor includes a quad detector with a NFOV placed behind a MEMS mirror with a WFOV, allowing the quad detector to scan a larger area for an incoming laser beam. The MEMS mirror is configured to continuously scan in an x-direction and in a y-direction until the incoming laser beam is detected on the quad detector, and upon detecting the incoming laser beam on the quad detector, center the incoming laser beam on the quad detector, when the incoming laser beam is not centered on the quad detector.

In some embodiments, the quad detector is transitioned from an acquisition mode to a tracking mode when the quad detector detects the incoming laser beam.

Also, in some embodiments, the MEMS mirror is configured to repeat the scanning in the x-direction and the y-direction when the incoming laser beam is lost on the quad detector. In some additional embodiments, the MEMS mirror is further configured to repeatedly scan in the x-direction until the incoming laser beam is detected on the quad detector or until the MEMS mirror completes scanning in the x-direction. When the MEMS mirror completes scanning in the x-direction, the MEMS mirror is further configured to move in a y-direction, allowing for scanning in the x-direction until the incoming laser beam is detected on the quad detector or until the MEMS mirror completes scanning in the x-direction.

In certain embodiments, the adjustment of the MEMS mirror to centrally locate the incoming laser beam occurs prior to commanding a transmit laser beam. Further, the MEMS uses each individual output of the quad detector to calculate a location of the incoming laser beam in relation to each cell in the quad detector such that the x-position and y-position of the incoming laser beam is determined within quad detector.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A computer-implemented process, comprising:
performing, by a micro-electromechanical system (MEMS) mirror and a quad detector, continuous scanning in an x-direction and in a y-direction until an incoming laser beam is detected on the quad detector, wherein the quad detector is placed directly behind the MEMS mirror producing a wide field of view (FOV) to scan a larger area for the incoming laser beam;
transitioning the quad detector from an acquisition mode to a tracking mode while using the MEMS mirror when the incoming laser beam is detected by the quad detector; and
adjusting the MEMS mirror to center the incoming laser beam on the quad detector, when the incoming laser beam is not centered on the quad detector, wherein the adjusting the MEMS mirror comprises calculating a location of the incoming laser beam in relation to each cell in the quad detector.

2. The computer-implemented process of claim 1, further comprising:
repeating the continuous scanning in the x-direction and the y-direction, when the incoming laser beam is lost on the quad detector.

3. The computer-implemented process of claim 1, wherein the performing of the continuous scanning comprises
repeatedly scanning in the x-direction until the incoming laser beam is detected on the quad detector or until the MEMS mirror completes scanning in the x-direction.

4. The computer-implemented process of claim 3, wherein the performing of the continuous scanning comprises
when the MEMS mirror completes scanning in the x-direction, moving the MEMS mirror in a y-direction and repeatedly scanning in the x-direction until the incoming laser beam is detected on the quad detector or until the MEMS mirror completes scanning in the x-direction.

5. The computer-implemented process of claim 1, wherein the adjusting of the MEMS mirror to centrally locate the incoming laser beam occurs prior to commanding a transmit laser beam.

6. The computer-implemented process of claim 1, wherein the adjusting of the MEMS mirror comprises
using each individual output of the quad detector, calculating a location of the incoming laser beam in relation to each cell in the quad detector such that the x-position and y-position of the incoming laser beam is determined within quad detector.

7. The computer-implemented process of claim 1, further comprising:
positioning the quad cell behind the MEMS mirror to produce a wide field of view (WFOV) to scan a larger area for the incoming laser beam.

8. An apparatus, comprising:
a quad detector with a narrow field of view (NFOV); and
a micro-electromechanical system (MEMS) mirror with a wide field of view (WFOV), wherein
the quad detector is directly placed behind the MEMS mirror to produce a WFOV, allowing the quad detector to scan a larger area for the incoming laser beam, and
the quad detector is configured to detect an x-position and a y-position of the incoming laser beam by calculating a location of the incoming laser beam in relation to each cell in the quad detector.

9. The apparatus of claim 8, wherein the MEMS mirror is configured to
continuously scan in an x-direction and in a y-direction until the incoming laser beam is detected on the quad detector, and
upon detecting the incoming laser beam on the quad detector, center the incoming laser beam on the quad detector, when the incoming laser beam is not centered on the quad detector.

10. The apparatus of claim 9, wherein the quad detector is transitioned from an acquisition mode to a tracking mode when the quad detector detects the incoming laser beam.

11. The apparatus of claim 9, wherein the MEMS mirror is configured to repeat the scanning in the x-direction and the y-direction when the incoming laser beam is lost on the quad detector.

12. The apparatus of claim 9, wherein the MEMS mirror is configured to repeatedly scan in the x-direction until the incoming laser beam is detected on the quad detector or until the MEMS mirror completes scanning in the x-direction.

13. The apparatus of claim 12, wherein, when the MEMS mirror completes scanning in the x-direction, the MEMS mirror is further configured to move in a y-direction, allowing for scanning in the x-direction until the incoming laser beam is detected on the quad detector or until the MEMS mirror completes scanning in the x-direction.

14. The apparatus of claim 9, wherein the adjustment of the MEMS mirror to centrally locate the incoming laser beam occurs prior to commanding a transmit laser beam.

15. The apparatus of claim 9, wherein the MEMS uses each individual output of the quad detector to calculate a location of the incoming laser beam in relation to each cell in the quad detector such that the x-position and y-position of the incoming laser beam is determined within quad detector.

16. An acquisition and tracking sensor, comprising:
a quad detector with a narrow field of view (NFOV) placed directly behind a micro-electromechanical system (MEMS) mirror with a wide field of view (WFOV), allowing the quad detector to scan a larger area for an incoming laser beam, wherein
the MEMS mirror is configured to
continuously scan in an x-direction and in a y-direction until the incoming laser beam is detected on the quad detector,
upon detecting the incoming laser beam on the quad detector, center the incoming laser beam on the quad detector, when the incoming laser beam is not centered on the quad detector, and
the quad detector is configured to detect an x-position and a y-position of the incoming laser beam by calculating a location of the incoming laser beam in relation to each cell in the quad detector.

17. The acquisition and tracking sensor of claim 16, wherein the quad detector is transitioned from an acquisition mode to a tracking mode when the quad detector detects the incoming laser beam.

18. The acquisition and tracking sensor of claim 16, wherein the MEMS mirror is configured to repeat the scanning in the x-direction and the y-direction when the incoming laser beam is lost on the quad detector.

19. The acquisition and tracking sensor of claim 16, wherein the MEMS mirror is further configured to repeatedly scan in the x-direction until the incoming laser beam is detected on the quad detector or until the MEMS mirror completes scanning in the x-direction.

20. The acquisition and tracking sensor of claim 19, wherein, when the MEMS mirror completes scanning in the x-direction, the MEMS mirror is further configured to move in a y-direction, allowing for scanning in the x-direction until the incoming laser beam is detected on the quad detector or until the MEMS mirror completes scanning in the x-direction.

21. The acquisition and tracking sensor of claim 16, wherein the adjustment of the MEMS mirror to centrally locate the incoming laser beam occurs prior to commanding a transmit laser beam.

22. The acquisition and tracking sensor of claim 16, wherein the MEMS uses each individual output of the quad detector to calculate a location of the incoming laser beam in relation to each cell in the quad detector such that the x-position and y-position of the incoming laser beam is determined within quad detector.

* * * * *